United States Patent [19]

Harris et al.

[11] 4,144,499
[45] Mar. 13, 1979

[54] SEARCH CIRCUIT FOR A RADIO RECEIVER

[75] Inventors: Raymond W. Harris, Rustburg; Ralph R. Sherman, Jr., Forest, both of Va.

[73] Assignee: General Electric Company, Lynchburg, Va.

[21] Appl. No.: 819,863

[22] Filed: Jul. 28, 1977

[51] Int. Cl.² .............................................. H04B 1/32
[52] U.S. Cl. ................................................... 325/470
[58] Field of Search ............... 325/334, 335, 453, 459, 325/464, 468, 469, 470

[56] References Cited

U.S. PATENT DOCUMENTS

| 3,794,925 | 2/1974 | Imazeki | 325/470 |
| 3,893,049 | 7/1975 | Bray | 325/459 |
| 3,973,228 | 8/1976 | Mueller et al. | 325/464 |
| 4,061,982 | 12/1977 | Kawashima | 325/468 |

Primary Examiner—Robert L. Griffin
Assistant Examiner—Marc E. Bookbinder
Attorney, Agent, or Firm—James J. Williams

[57] ABSTRACT

A search circuit is provided for sequentially activating selected local oscillators to cause a radio receiver to receive the radio frequency channel corresponding to the frequency of the activated local oscillator. The search circuit provides repetitive pulses which are passed through a skip circuit and are then decoded in sequence. The decoded signals are applied to respective local oscillators and are also applied to respective memory circuits. Each memory circuit can be preset with a scan or a skip memory signal. If preset with a scan memory signal, a memory circuit produces a constant scan output. If preset with a skip memory signal, a memory circuit produces a skip output each time it receives its respective decoder signal. All of the memory circuit outputs are applied to the skip circuit. Each memory circuit which produces a scan output causes the skip circuit to pass the repetitive pulses through without change. Each memory circuit which produces a skip output causes the skip circuit to provide a short duration, additional pulse between the repetitive pulses. This additional pulse causes the next decoded signal in the sequence to be produced, thus skipping a channel.

12 Claims, 5 Drawing Figures

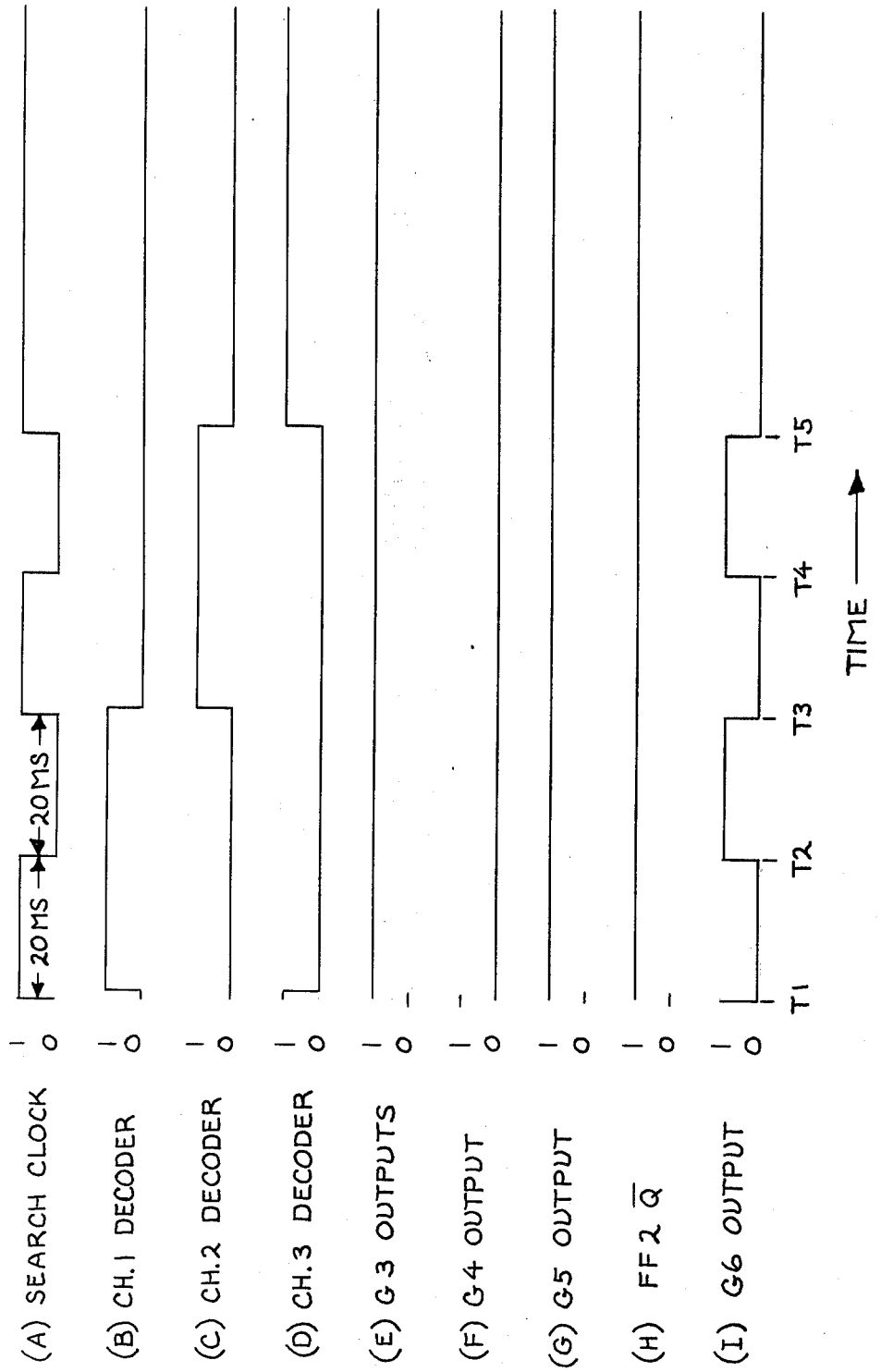

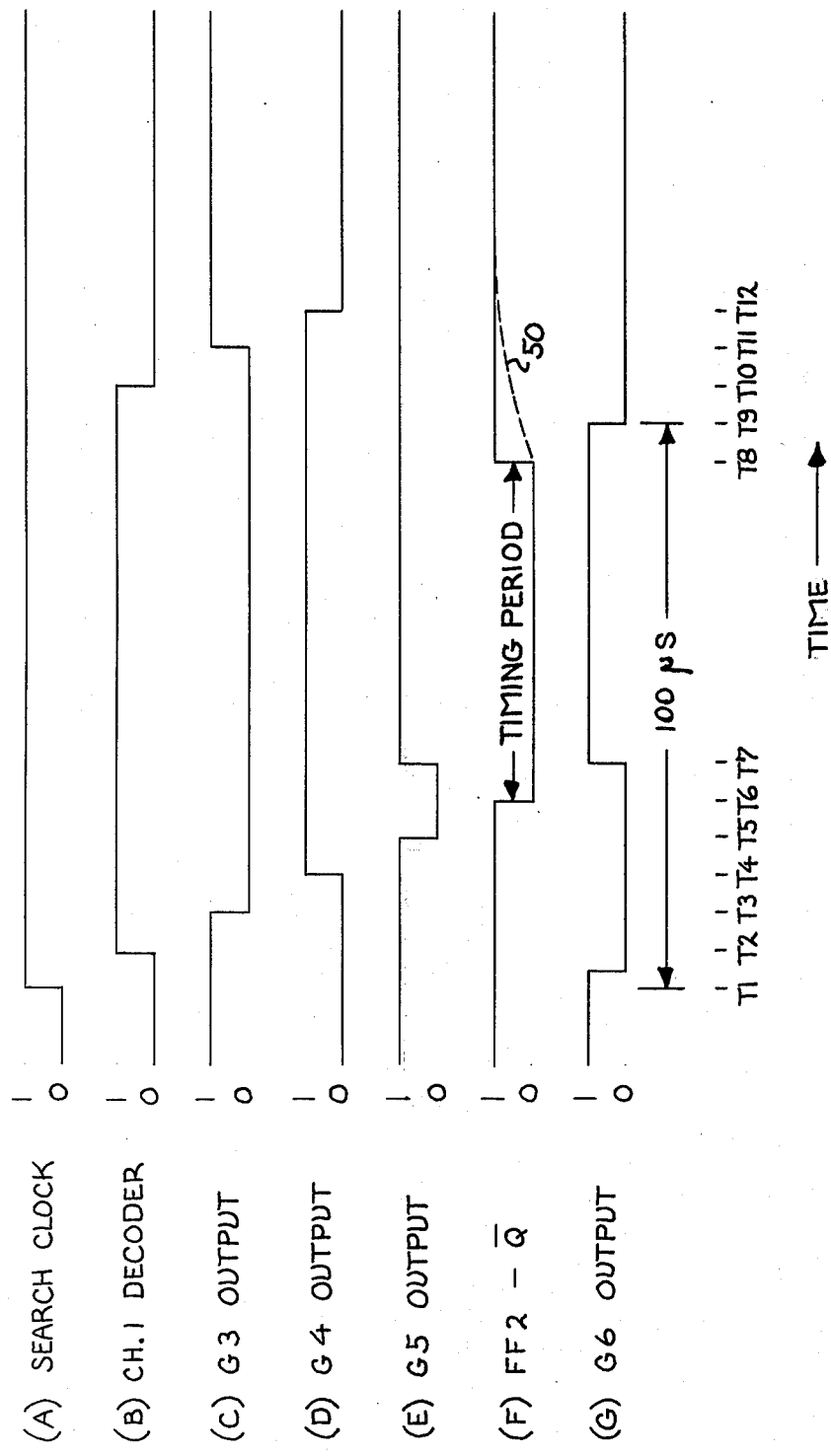

SEARCH CIRCUIT FOR A RADIO RECEIVER

CROSS REFERENCE TO RELATED APPLICATIONS

This application is related to the application entitled "Improved Circuit for Programming the Search Circuit of a Radio Receiver", filed July 28, 1977, Ser. No. 819,862, and assigned to the same assignee as this application.

BACKGROUND OF THE INVENTION

Our invention relates to a search circuit for a radio receiver or the like, and particularly to a search circuit that can cause a selected channel to be quickly skipped without determining whether a signal is present on that channel.

Search receivers are used to automatically scan a plurality of channels in a selected sequence. The scanning of each channel is accomplished by sequentially activating each local oscillator to cause the receiver to be receptive to a corresponding channel. If a signal is present when a channel is scanned, the receiver remains tuned to that channel until the signal ends. If no signal is present on a scanned channel, the receiver resumes scanning. There are, of course, times when a listener may not want the receiver to scan or search every channel.

Accordingly, a primary object of our invention is to provide a new and improved search circuit for a radio receiver that permits one or more channels to be skipped.

Another object of our invention is to provide a new and improved search circuit that causes a radio receiver to automatically tune to a plurality of channels, but that permits undesired channels to be quickly skipped so that desired channels are scanned more frequently.

Another object of our invention is to provide a new and improved search circuit that causes a radio receiver to scan selected radio channels and to skip other radio channels.

SUMMARY OF THE INVENTION

Briefly, these and other objects are achieved in accordance with our invention by a search circuit which includes a source of repetitive clock pulses having a predetermined time period between adjacent clock pulses. A skip circuit is connected to the source of clock pulses, and a decoder has its input connected through a counter to the skip circuit. The decoder has an output for each channel that produces a respective signal in response to respective counts of the clock pulses. The decoder outputs may also be utilized to activate the receiver oscillators. A memory circuit is provided for each channel. Each memory circuit has a memory input which can be preset with a scan or a skip signal that arranges the memory circuit for scanning or skipping. Each memory circuit also has a channel signal input connected to a respective decoder output. Each memory circuit produces a constant scan signal if it has been arranged for scanning, or produces a skip signal if it has been arranged for skipping and during the presence of its respective channel signal. The skip circuit is also provided with a plurality of inputs each of which is respectively coupled to one of the memory circuit outputs. As the skip circuit receives clock pulses, it supplies these clock pulses to the decoder as a function of the various memory signal outputs applied to the skip circuit. As the memory circuits produce their respective outputs, the skip circuit supplies the clock pulses to the decoder if scanning of a channel is called for, and supplies an additional pulse to the decoder if skipping a channel is called for. The additional pulse is supplied so rapidly that the receiver does not have a chance to respond, and scanning continues to the next channel. Thus, one or more selected channels may be skipped without appreciable loss of scanning time.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

FIGS. 4 and 5 show waveforms for illustrating the operation of our search circuit of FIGS. 2 and 3.

DESCRIPTION OF A PREFERRED EMBODIMENT

Figure 1:
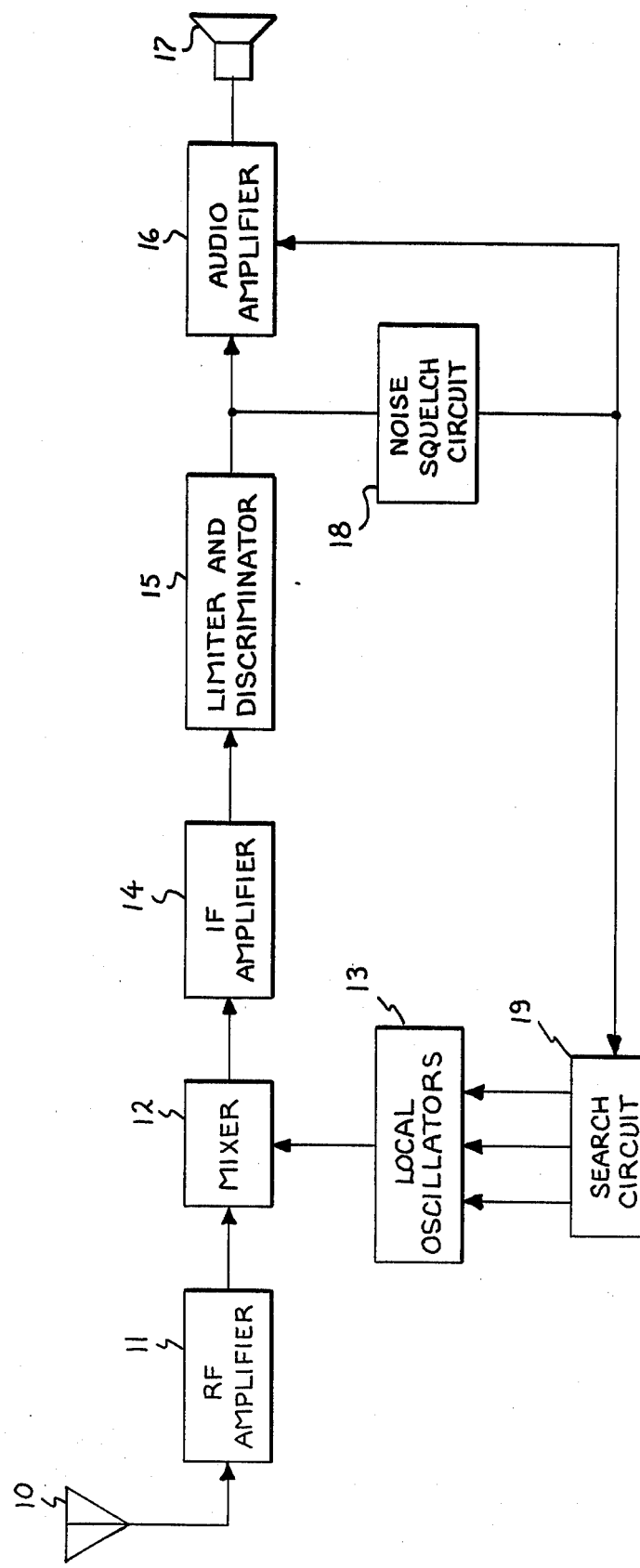
FIG. 1 shows a block diagram of a radio receiver having a search circuit such as provided by our invention.

FIG. 1 shows a typical, known frequency modulation receiver having a search circuit such as provided in accordance with our invention. Such a receiver is connected to an antenna 10 which supplies signals to a radio frequency (RF) amplifier 11. These amplified signals are applied to a mixer 12 which also receives a signal from one of a plurality of local oscillators 13. The frequency derived from the oscillators 13 determines the frequency of reception of the receiver. The mixed signals, usually a difference frequency, are applied to an intermediate frequency (IF) amplifier 14. The amplified signals are then applied to a limiter and discriminator 15 which produces audible signals. The audible signals are supplied to an amplifier 16 and reproduced by any suitable means such as a loudspeaker 17. As known in the art, audible signals from the limiter and discriminator 15 are also supplied to a noise squelch circuit 18. Typically, the noise squelch circuit 18 includes a high pass filter. In the presence of no radio frequency carrier, the filter produces a noise signal which is called a squelch signal. This squelch signal prevents the audio amplifier 16 from passing audio signals. When a radio frequency carrier is received, the noise signals passed by the filter are reduced or disappear, and the filter produces an unsquelch signal. This unsquelch signal permits the amplifier 16 to pass audible signals.

The squelch and unsquelch signals are also applied to a search circuit 19. Such search circuits are known in the art, and include means for producing a sequence of signals to activate a corresponding plurality and sequence of the oscillators 13. In the absence of a received RF signal, the oscillators 13 are activated in sequence, so that the receiver is receptive to each of a plurality of radio frequencies. If, during the time an oscillator is activated, a signal is received on a frequency, the noise squelch circuit 18 produces an unsquelch signal which, in addition to its function for the audio amplifier 16, stops the search circuit 19 and causes the search circuit 19 to continue to activate the local oscillator corresponding to the frequency of the signal received. The receiver remains on this frequency until the signal terminates, after which, the noise squelch circuit 18 produces a squelch signal that permits the search circuit 19 to function again.

The receiver described above is known in the art as a search or scan receiver. While the receiver has been described in connection with frequency modulated signals, the circuit above as well as our invention can also be used with other modulated signals, such as amplitude modulation. The other types of modulation simply require that some indication be given when a signal is received.

Figure 2:
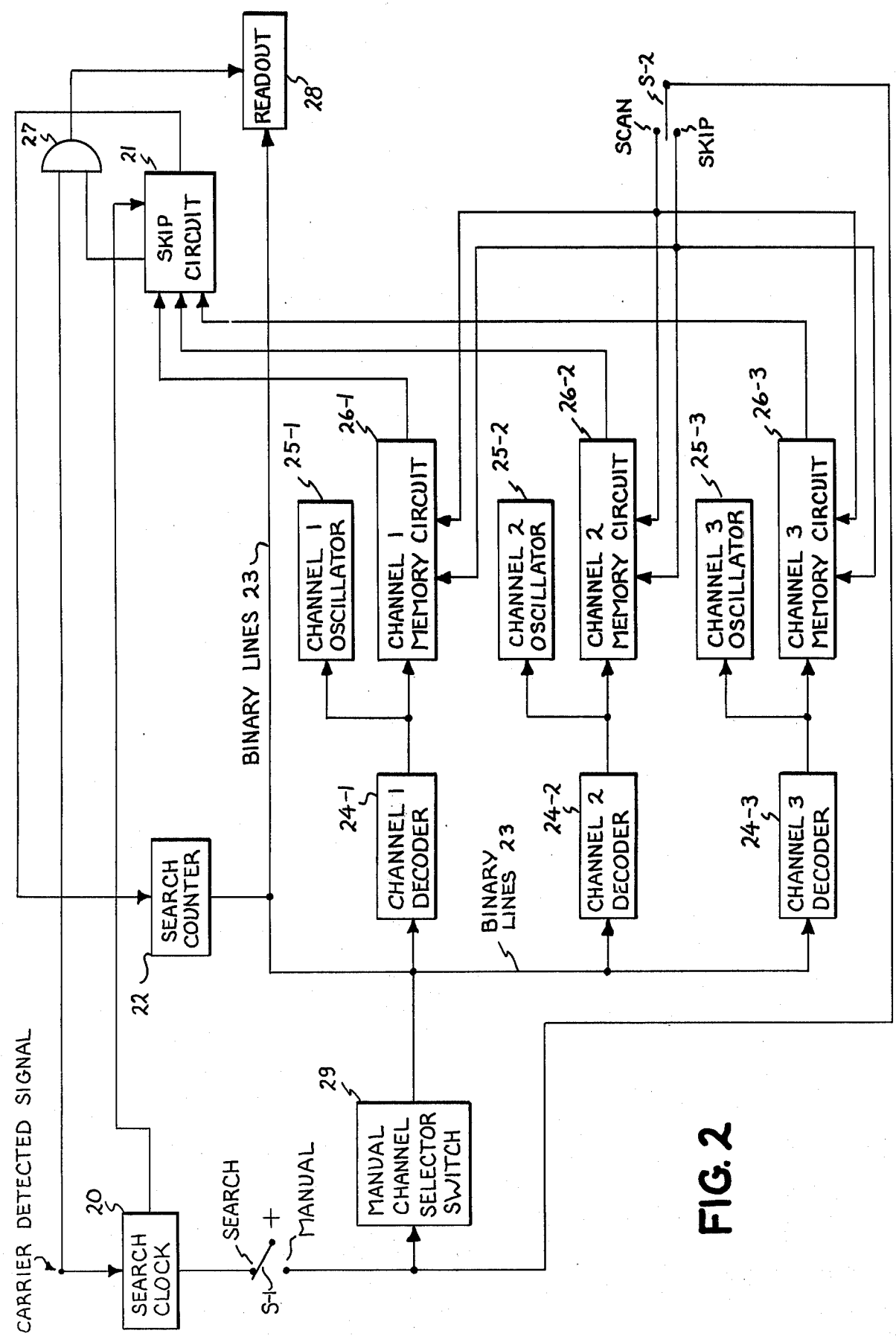
FIG. 2 shows a block diagram of a search circuit in accordance with our invention which can be used in the receiver of FIG. 1.

FIG. 2 shows a block diagram of a search circuit in accordance with our invention which can be used for the search circuit 19 of FIG. 1. Our circuit uses a number of logic elements, and in this application, we have assumed that a logic 1 is represented by a positive voltage and that a logic 0 is represented by a zero voltage. Other voltage values may be used. In FIG. 2, we have assumed that the receiver is to search or scan three channels. However, any number of channels can be searched or scanned in accordance with our invention. Our search circuit includes a search clock 20 which produces repetitive pulses at a selected rate, for example at a frequency of 25 Hertz. Such pulses would have alternating logic 1 and logic 0 states of 20 milliseconds each. These pulses are applied to a skip circuit 21. The pulses are derived under the control of the skip circuit 21 and applied to a search counter 22. The search counter 22 may include a series of flip-flops or other logic devices that produce binary count signals on two binary lines 23 (shown as a single line for simplicity). Two binary lines permit a binary count from one through four, which is sufficient for the three channels. Five through eight channels would require a third binary line, and nine through sixteen channels would require a fourth binary line. As an example for three channels, the two binary lines 23 could have the signals 01, 10, and 11 in repetitive sequence, changing between each pair of signals in response to each clock pulse received by the search counter 22. If a fourth channel were used, the binary lines 23 could also have the signals 00 in the sequence.

A plurality of channel decoders 24-1, 24-2, 24-3 are coupled to the binary lines 23. The decoders are shown as separate units, but it is to be understood that a single decoder unit with a common input and a plurality of outputs can be used, and is intended to be included by the decoders shown. The decoder outputs produce signals in repetitive sequence. The decoders may include logic gates which pass only a predetermined signal configuration on the binary lines 23 so that only one decoder responds at a time to produce an output signal. Thus, the channel 1 decoder 24-1 responds only to each occurrence of the binary signals 01; the channel 2 decoder 24-2 responds only to each occurrence of the binary signals 10; and the channel 3 decoder 24-3 responds only to each occurrence of the binary signals 11. As each decoder responds to its appropriate signals, it is arranged to produce a logic 1 at its output.

The outputs of the decoders are respectively applied to oscillators 25-1, 25-2, 25-3. When an oscillator receives a logic 1 from its respective decoder, it is activated so as to cause the receiver (of FIG. 1) to be responsive to a radio frequency corresponding to the oscillator frequency. The outputs of the decoders are also respectively applied to memory circuits 26-1, 26-2, 26-3. When a memory circuit is provided with a logic 1 from its respective decoder, the memory circuit can be arranged or preset to scan or skip by momentarily moving a switch S2 (when energized) from its normal disengaged position shown either to its scan contact or to its skip contact. Each of the memory circuits produces a steady logic 1 (i.e. blocks its decoder signal) at its output if its memory has been arranged for scanning by the energized switch S2. However, if a memory circuit has been arranged by the energized switch S2 to skip its respective channel, it produces a logic 1 when its respective decoder is not responsive, and produces a logic 0 when its respective channel decoder is responsive.

The outputs of the memory circuits are respectively applied to memory inputs of the skip circuit 21 to control the skip circuit 21. When the search counter 22 produces logic signals on the binary lines 23 corresponding to the time of scanning of a given channel, if that given channel is to be scanned, the inputs to the skip circuit 21 permit the pulse from the search clock 20 to pass through the search counter 22 without modification. However, if at that time the given channel is to be skipped, the skip circuit 21 produces an additional pulse which causes the search counter 22 to change the outputs on the binary lines 23 to the next sequence. Thus, the channel which was to have been scanned is rapidly skipped, and next decoder in the sequence can respond to produce an appropriate signal on the binary lines 23.

If a signal is received on the channel being scanned, a logic 1 carrier detected signal (which may be the unsquelch signal from the noise squelch circuit 18 of FIG. 1) is produced. This signal is applied to the search clock 20 to stop the search clock for the duration of the received signal. Searching is stopped until the received signal ends, after which the search clock 20 is permitted to run again. During the time that a given channel is scanned, the skip circuit 21 produces a logic 1 which is applied to an AND gate 27. If the carrier detected signal (assumed to be a logic 1) is provided at this time, the AND gate 27 produces a logic 1 which enables an indicator or readout circuit 28. And as will be explained in more detail, the readout circuit will only be enabled for those channels preset to be scanned during automatic searching or during manual selection. This saves power, which is important when supplied by a battery. During the time that the readout circuit 28 is enable or energized, it provides a suitable indication of the logic signals on the binary lines 23. The readout circuit 28 may be any suitable device, such as a seven segment numerical device, lamps, or any device that is known in the art.

A switch S1 is provided for automatic searching or for manual searching. The arm of the switch S1 is energized by a suitable voltage. When the switch S1 is in the upper search position as shown in FIG. 2, this voltage is applied to operate the search clock 20. When the switch S1 is in the lower manual position, the clock 20 is disabled, and a manual channel selector switch 29 is rendered operable or energized. The switch 29 may be a rotary switch having a plurality of positions (which can be indicated on a panel), each of which causes the energized switch 29 to produce predetermined binary signals. In other words, the switch 29 manually supplies the same signals as the search counter 22. The switch S2 is also rendered operable or energized by this lower position of the switch S1. When the manual channel selector switch 29 is made operable, a user may position or rotate the switch 29 to provide the appropriate binary signals on the lines 23 corresponding to the channel numbers. For the assumed example, when the switch 29 is in the position for channel 1, the binary lines 23 have the logic signals 01. When the switch 29 is in the position for channel 2, the binary lines 23 have the signals 10; and when the switch 29 is in the position for channel 3, the lines 23 have the signals 11. These signals are applied to the decoders 24-1, 24-2, 24-3 and to the readout 28 to cause the decoders to produce the respective channel signal, and cause the readout 28 to produce the respective channel indication.

Figure 3:
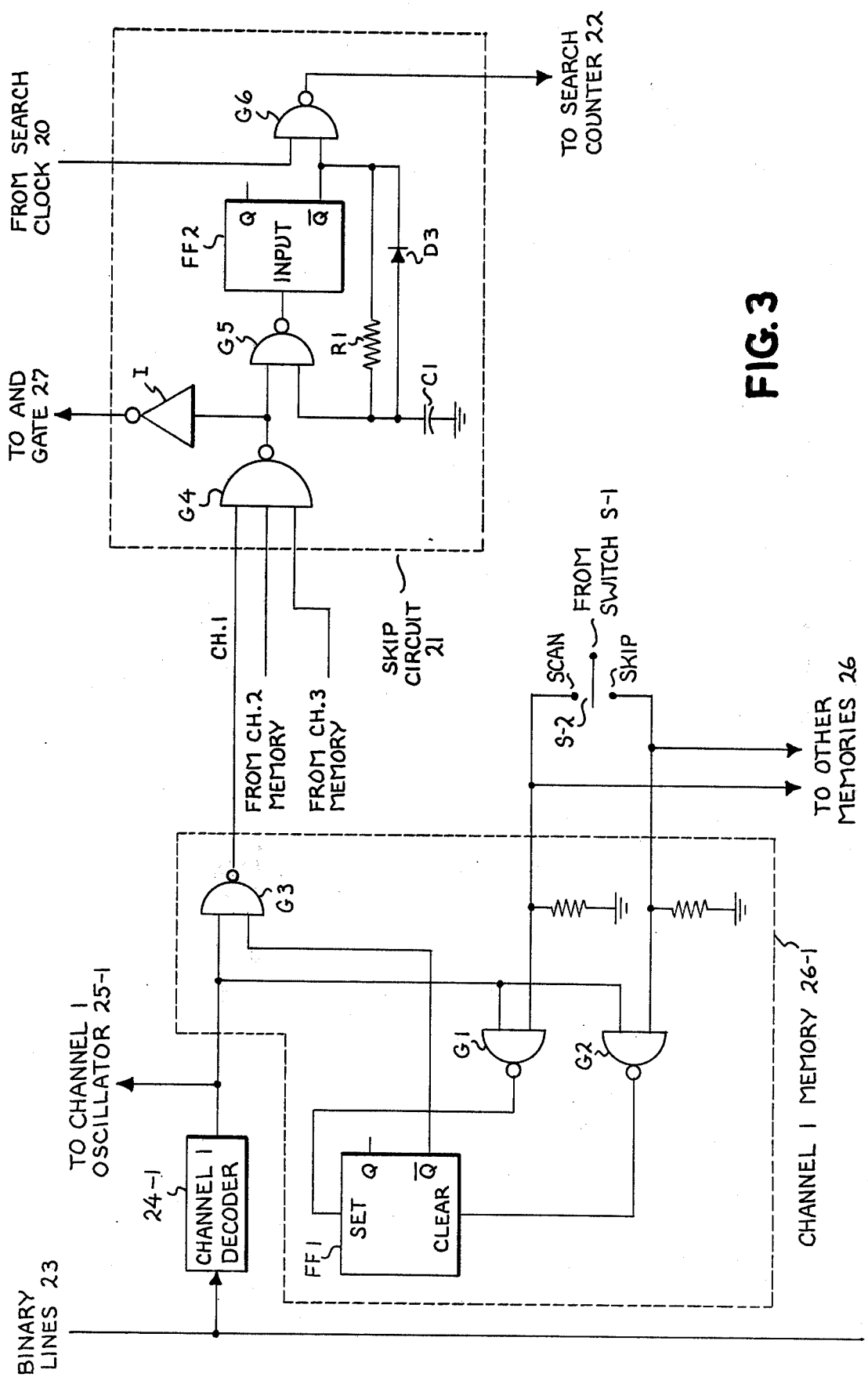
FIG. 3 shows a more detailed diagram of the memory circuit and the skip circuit of FIG. 2.

In FIG. 2, the search clock 20, the search counter 22, the manual selector switch 29, the decoders 24-1, 24-2, 24-3, the oscillators 25-1, 25-2, 25-3, and the readout circuit 28 are devices known in the art. Hence, it is believed that the block diagrams for these circuit elements is sufficient. However, we believe our memory circuits 26-1, 26-2, 26-3 and our skip circuit 21 are new, so that we show the memory 26-1 for channel 1 and the skip circuit 21 in more detailed form in FIG. 3. The memory circuits for channels 2 and 3 would be similar. FIG. 3 utilizes a number of NAND gates, such as a two input NAND gate G1 and a three input NAND gate G4. As known in the art, if any input to a NAND gate is at a logic 0, the NAND gate produces a logic 1 at its output. If all inputs of a NAND gate are at a logic 1, then the NAND gate produces a logic 0. The memory circuit of FIG. 3 uses a bistable flip-flop FF1 whose set input, clear input, and $\overline{Q}$ output are used. The flip-flop FF1 is set by applying a logic 0 to its set input to cause the $\overline{Q}$ output to provide a logic 0. The flip-flop FF1 is cleared by applying a logic 0 to its clear input to cause the $\overline{Q}$ output to provide a logic 1. A monostable flip-flop FF2 is used in the skip circuit 21. In its normal stable condition, the flip-flop FF2 produces a logic 1 at its $\overline{Q}$ output. The flip-flop FF2 may be triggered to its unstable condition (for a selected predetermined time depending upon its timing components) by applying a logic 0 to its input. Upon receipt of this logic 0 trigger, the $\overline{Q}$ output produces a logic 0 for the predetermined time, and then returns to its normal stable logic 1. The $\overline{Q}$ output of the flip-flop FF2 is fed back to the gate G5 through a diode D3 for a logic 0, or through a timing resistor R1 and capacitor C1 for a logic 1. While we have shown only the one memory circuit 26-1, it is to be understood that the other memory circuits (the number depending upon the number of channels) may have the same configuration.

The binary lines 23 are connected to the channel 1 decoder 24-1. When the binary lines 23 have the proper logic signals for channel 1, namely 01, the channel 1 decoder 24-1 output switches from a logic 0 to a logic 1. This logic 1 causes a NAND gate G3 to produce a logic output determined by the memory input supplied from the $\overline{Q}$ output of the flip-flop FF1. The flip-flop FF1 is set or cleared depending upon the outputs of the NAND gates G1, G2. One input of the gate G1 is connected to the scan terminal of the switch S2, and one input of the gate G2 is connected to the skip terminal of the switch S2. The other inputs of the gates G1, G2 are connected to the decoder 24-1 for causing the gates G1, G2 to be responsive to the switch S2 when a decoder signal (logic 1) is present and when the switch S2 is energized by moving the switch S1 to the manual position. This operation of the switch S1 also energizes the manual selector switch 29. With channel 1 selected by the energized manual switch 29, the channel 1 decoder 26-1 produces a steady logic 1. With the switch S2 energized by the switch S1, the switch S2 is operated to its scan position to apply a logic 1 to the input of the gate G1. Both inputs to the gate G1 are at a logic 1 so that the gate G1 produces a logic 0 to set the flip-flop FF1. This causes the $\overline{Q}$ output to produce a logic 0 so that the gate G3 produces a steady scan (logic 1) signal. Thus changes in the channel 1 decoder 24-1 output are blocked by the gate G3 for a scan condition. At this point in time, all inputs to the gate G4 are at logic 1 so that the gate G4 produces a logic 0. This is inverted to a logic 1 by a logic inverter I and applied to the AND gate 27 (in FIG. 2). If the receiver is made to produce an unsquelch logic 1 signal, the AND gate 27 produces a logic 1 so that the readout circuit 28 is enabled and a visual indication given of the channel that is preset to be scanned. If the energized switch S2 is operated to the skip position, both inputs to the gate G2 are logic 1. The flip-flop FF1 is cleared and the $\overline{Q}$ output produces a logic 1. This permits the gate G3 to produce a logic 0 when the decoder 24-1 produces a logic 1, and to produce a logic 1 when the decoder 24-1 produces a logic 0. In other words, the decoder outputs are passed by the gate G3 for a skip condition. At this time when the gate G3 produces a logic 0, this causes the gate G4 to produce a logic 1. This is inverted to a logic 0 by the inverter I so that the AND gate 27 produces a logic 0 and the readout circuit 28 is not enabled. Hence no visual indication is given for a channel that is preset to be skipped. The other memory circuits of FIG. 2 are arranged or programmed in the same manner.

The output from the gate G3 is applied to the channel 1 input of the gate G4 in the skip circuit 21. 1 Similar outputs from the other channel memory circuits are applied to the other inputs of the gate G4. The output of the gate G4 is applied to one input of a NAND gate G5. If all inputs to the gate G4 are at a logic 1, (as they would be for a channel to be scanned), the gate G4 produces a logic 0 at its output. This logic 0 at one input of the gate G5 causes a logic 1 to be applied to the input of the flip-flop FF2. This has no effect on the flip-flop FF2. However, if a channel is to be skipped, one of the inputs to the gate G4 switches to a logic 0 when that channel decoder produces a logic 1. This logic 0 causes the gate G4 to produce a logic 1 which is applied to the gate G5. The $\overline{Q}$ output of the flip-flop FF2 is also at a logic 1 and is applied to the gate G5 so that gate G5 produces a logic 0 that causes switching of the flip-flop FF2 for a predetermined time. This switching causes the $\overline{Q}$ output of the flip-flop FF2 to switch to a logic 0 which causes the gate G6 to produce a logic 1 at its output for the time duration that the flip-flop FF2 is in its switched or unstable state. After the timed duration, the $\overline{Q}$ output returns to a logic 1. The gate G6 produces a logic 0 which is applied to the search counter 22 to add one more pulse or signal to the counter 22. This causes the counter 22 to produce another count so that the binary lines 23 switch to their next logic state as though another pulse from the search clock 20 had been received. The pulse produced by the flip-flop FF2 is very rapid, in the order of 50 microseconds for example, so that the added pulse is received very quickly to cause the search counter 22 to switch to its next count condition. Thus, skipping is achieved very quickly without any interruption or indication in a radio receiver. This is emphasized by the fact that the short duration (in the order of microseconds) of the added pulse is very small compared to the relatively long duration (for example 40 milliseconds) between leading edges of the clock pulses.

Our circuit of FIGS. 2 and 3 is further explained in connection with the waveforms of FIGS. 4 and 5. For FIG. 4, we have assumed that the switch S1 was placed in its manual position, the receiver was made to produce an unsquelch (logic 1) signal, the selector switch 29 moved to each of the three channel positions, and the switch S2 moved to the scan position for each selected channel to preset the three memories for scanning. Thus, any number of channels can be preset or programmed by only three switches. And as the switch S2 was moved to the scan position for each channel, a visual indication was given by the circuit 28. After the memories are preset, the switch S1 is moved to the search position. The waveforms of FIG. 4 are plotted along a common time axis. FIG. 4A shows the pulses provided by the search clock 20, and we have assumed that the search clock varies between logic 0 and logic 1 for equal 20 millisecond periods. At the time T1, the search clock goes from a logic 0 to a logic 1. This causes the gate G6 to produce a logic 0 as shown in FIG. 4I. We have assumed that the binary lines 23 switch to the signals 01 at this time T1. Shortly after the time T1, the channel 1 decoder switches from a logic 0 to a logic 1 as shown in FIG. 4B. At about the same time the channel 3 decoder, which had been previously activated, switches from a logic 1 to a logic 0. The channel 2 decoder and the channel 3 decoder outputs are at a logic 0 as shown in FIGS. 4C and 4D. With all channels programmed or arranged to be scanned, each of their respective flip-flops FF1 in their memory circuits produce a logic 0 at the $\overline{Q}$ output. Hence, all gates G3 produce a steady logic 1 at their output as shown in FIG. 4E. With all gates G3 producing a logic 1, all inputs to the skip circuit gate G4 are at a logic 1, so that the gate G4 produces a logic 0 at its output as shown in FIG. 4F. This causes the gate G5 to produce a logic 1 as shown in FIG. 4G. The flip-flop FF2 is in its normal condition with the $\overline{Q}$ output at a logic 1 as shown in FIG. 4H. Since the $\overline{Q}$ output is at a logic 1, the search clock applied to the other input of the gate G6 causes the gate G6 to follow the search clock as shown in FIG. 4I. At the time T2, the search clock switches from a logic 1 to a logic 0, and this causes the gate G6 to switch from a logic 0 to a logic 1. Nothing further happens until the time T3 when the search clock switches from a logic 0 back to a logic 1. Shortly after this, the search counter 22 produces a different output so that the binary lines 23 have the signals 10. This causes the channel 1 decoder to switch from a logic 1 to a logic 0 and the channel 2 decoder to switch from a logic 0 to a logic 1. Nothing further happens until the time T4 when the search clock switches back to a logic 0, causing the gate G6 to switch to a logic 1. At the time T5, the search clock again switches from a logic 0 to a logic 1, the gate G6 produces a logic 0, and this causes the binary lines 23 to have the signals 11. The channel 1 decoder does not respond to this, and the channel 2 decoder switches back from a logic 1 to a logic 0. The channel 3 decoder switches from a logic 0 to a logic 1.

After the time T5, and while the channel 3 decoder produces a signal to activate the channel 3 oscillator, we have assumed that a signal is received by the receiver on channel 3. This signal causes the search clock 20 to stop switching or producing pulses, so that even though the gate G6 will pass pulses, the pulses at its output remain at a logic 0 as shown in FIG. 4I after the time T5. The circuit remains stable during the time that the signal is received. During this time, the gate G4 is producing a logic 0 which is inverted by the inverter I to a logic 1. This logic 1, along with the carrier detected or unsquelch signal (logic 1) is applied to the AND gate 27 to produce a logic 1 that enables the readout circuit 28. With the readout circuit 28 activated, and the binary lines 28 supplying the signals 11, the readout circuit 28 provides an indication of channel 3. This indication may be in any form desired, such as the seven segment readout device mentioned earlier.

When the signal on channel 3 terminates, the carrier detected signal returns to a logic 0 which enables the search clock 20 to begin producing pulses once again. Thereafter, the operation continues as shown in FIG. 4 until another signal is received.

FIG. 5 shows a group of waveforms plotted along a common time axis for illustrating the operation of our search circuit when channel 1, for example, is to be skipped, and channels 2 and 3 are to be scanned. The waveforms of FIG. 5 are plotted along a greatly enlarged time axis. For example, in FIG. 5 the time from the time T1 to the time T9 is only about 100 microseconds as opposed to the 20 milliseconds illustrated in FIG. 4. When a channel is to be skipped, the switch S1 is connected to its manual contact to enable the manual switch 29, and the manual switch 29 is then positioned to the channel to be skipped, namely channel 1. This causes the binary lines 23 to have the signals 01, which are decoded by the channel 1 decoder 24-1. This causes the readout circuit 28 to indicate channel 1 if channel 1 had been previously preset to be scanned. With the channel 1 decoder producing a logic 1, the switch S2 is momentarily pushed to its skip position and this provides the gate G2 with two logic 1's. The gate G2 produces a logic 0 which clears the flip-flop FF1 so that the $\overline{Q}$ output is at a logic 1. This enables the gate G3 to produce outputs which follow the channel 1 decoder signals. While the switch 29 is set on channel 1, the decoder 24-1 and the $\overline{Q}$ output are both logic 1. The gate G3 produces a logic 0, and the gate G4 produces a logic 1. The inverter I changes this logic 1 to a logic 0 which causes the AND gate to produce a logic 0 that disables or turns off the readout circuit 28. This indicates that channel 1 is preset to be skipped. Channels 2 and 3 are arranged for scanning, and this is done by first setting the manual selector switch for channel 2 and then moving the switch S2 to the scan position. This sets the flip-flop FF1 so that the $\overline{Q}$ output is at a logic 0 that causes the gate G3 for channel 2 to produce a steady logic 1. All inputs to the gate G4 are at logic 1 so that the gate G4 produces a logic 0. This is inverted to a logic 1 by the inverter I so that the AND gate 27 (which also has a logic 1 unsquelch signal) produces a logic 1 that enables the readout circuit 28. This indicates that channel 2 is preset to be scanned. The same operation is then performed for channel 3.

With channel 1 arranged for skipping and channels 2 and 3 arranged for scanning, the switch S1 is then returned to its search position. The receiver is set for normal squelch. The search clock 20 then begins to produce pulses as shown in FIG. 4A. In FIG. 5A, we have assumed that at the time T1 the search clock produces a pulse of logic 1. The $\overline{Q}$ output of the flip-flop FF2 is at a logic 1, so that when the search clock switches to a logic 1, the gate G6 produces a logic 0 shortly after the time T1 as shown in FIG. 5G. This logic 0 causes the search counter 22 to produce the 01 signals on the binary lines 23. At the time T2, the channel 1 decoder responds to this condition and produces a logic 1 as shown in FIG. 5B. Since the $\overline{Q}$ output of flip-flop FF1 for channel 1 is already at a logic 1, the gate G3 then produces a logic 0 as shown in FIG. 5C at the time T3. The inputs to the gate G4 for channels 2 and 3 are at a steady logic 1 signifying both channels are to be scanned. But when the output of the gate G3 goes to a logic 0, this causes the gate G4 to produce a logic 1 at the time T4 as shown in FIG. 5D.

When the gate G4 produces a logic 1, this logic 1 is inverted to a logic 0 to disable the AND gate 27. This logic 1 and the logic 1 from the $\overline{Q}$ output of the flip-flop FF2 cause the gate G5 to produce a logic 0 as shown in FIG. 5E at the time T5. This logic 0 causes the flip-flop FF2 to change to its unstable state beginning at the time T6 as shown in FIG. 5F. The $\overline{Q}$ output switches to a logic 0 which causes the gate G6 to produce a logic 1 at the time T7. The $\overline{Q}$ output is also fed back through the diode D3 without delay to the input of the gate G5. This causes the gate G5 to produce a logic 1 at the time T7.

Summarizing the action to this point, the search clock produced the pulse calling for channel 1 to be scanned. However, the gate G6 produced the needed pulse shortly after the time T1 but only until the time T7, a period much too short for the receiver to respond to a carrier and produce a carrier detected signal. At the time T7, the output of the gate G6 returns to a logic 1. The next action to take place is the end of the timing period of the flip-flop FF2 at the time T8. When this occurs, the $\overline{Q}$ output switches to a logic 1 as shown in FIG. 5F. This logic 1 (assumed positive) cannot pass through the diode D3 so that the capacitor C1 begins to receive a charge through the resistor R1 as indicated by the dashed line 50 in FIG. 5F. This provides a delay that keeps the input to the gate G5 at a logic 0 sufficiently long for the gate G4 to produce a logic 0 as will be explained. The $\overline{Q}$ of logic 1 (with the clock pulse still at a logic 1) causes the gate G6 to produce another logic 0 at the time T9. This provides another count pulse to the counter 22 which then produces the next count at its output, which for channel 2 would be the signals 10. The channel 1 decoder switches back to a logic 0 at the time T10. This causes the gate G3 to produce a logic 1 as shown at the time T11. At this time, all inputs to the gate G4 are again at a logic 1 so that the gate G4 produces a logic 0 at the time T12. This logic 0 occurs before the other input to the gate G5 (derived from the $\overline{Q}$ output of the flip-flop FF2) reaches a logic 1. Otherwise, the flip-flop FF2 would be triggered to its unstable or timing state again. The needed time is provided by the fact that the capacitor C1 must be charged through the resistor R1 from the $\overline{Q}$ output, and the time constant of this circuit is arranged so that the input for the gate G5 (derived from the $\overline{Q}$ output) does not reach a logic 1 level until after the output of the gate G4 switches to a logic 0.

In summary, when a channel is skipped, our skip circuit 21 provides an additional skip pulse, in the example of FIG. 5 this pulse being provided at the time T9 when the output of the gate G6 goes to a logic 0 for the second time following a clock pulse. In the example just given, the logic 0 produced by the gate G6 after the time T1 caused the channel 1 decoder to be activated. The logic 0 produced by the gate G6 at the time T9 deactivated the channel 1 decoder and activated the channel 2 decoder. If channel 2 were to be skipped, a similar operation in the channel 2 memory and in the skip circuit would take place. And again, it should be noted that this operation is very rapid or high speed, requiring only approximately 100 microseconds for a skipping as opposed to the 40 milliseconds of time for a normal scan. Thus, 10 channels could easily be skipped, since such skipping would only require 10 times 100 microseconds or 1 millisecond. This is far less than the normal 40 millisecond scanning period. And it is so rapid, that the receiver does not have an opportunity to respond to a signal on the channel, since the receiver would be activated for a time period much less than is needed for activation of the various circuits and production of the carrier detected signal.

It will thus be seen that we have provided a new and improved search circuit for radio receivers. Our search circuit includes an improved skip circuit which operates with a memory circuit for each channel to provide signals that cause scanning or skipping and that cause activation of the readout if a signal is detected. Each of the memories can be preset or programmed from the common switch S2 and the manual switch 29. Our circuit provides for improved high speed operation, and lends itself to large scale integrated circuits. While we have shown only one embodiment of our invention, persons skilled in the art will appreciate the modifications that can be made. For example, our search circuit can be provided for almost any number of channels, since its operation is so rapid. Other types of memory circuits, decoder circuits, and readout circuits may be utilized. Or the readout circuit may be omitted. Our circuit can also be used in receivers where a priority channel is arranged to always be scanned at selected times or intervals. Therefore, while we have described our invention with reference to a particular embodiment, it is to be understood that modifications may be made without departing from the spirit of the invention or from the scope of the claims.

What we claim as new and desire to secure by Letters Patent of the United States is:

1. An improved search circuit for a radio receiver having switchable local oscillator means connected to a mixer to cause said receiver to receive a plurality of frequencies, said improved search circuit comprising:
    a. first means for producing a repetitive sequence of predetermined channel signals and applying said channel signals to said local oscillator means to cause said local oscillator means to produce a selected frequency signal in response to each of said channel signals;
    b. a plurality of memory circuits each having an input coupled to said first means and an output, each of said memory circuits producing a respective skip signal at its output in response to a skip condition in said memory circuit and a respective channel signal from said first means, and producing a scan signal at its output in response to a scan condition in said memory circuit;
    c. a skip circuit having a plurality of inputs each of which is respectively coupled to one of said memory circuit outputs, said skip circuit having an output, and said skip circuit producing a skip pulse at said output in response to each skip signal produced at said memory circuit outputs;
    d. and means for applying each of said skip pulses to said first means.

2. The improved circuit of claim 1 and further comprising means for applying a source of recurring clock pulses to a further input of said skip circuit, and means for coupling said output of said skip circuit to said first means whereby said recurring clock pulses and each of said skip pulses are applied to said first means.

3. The improved circuit of claim 2 wherein each skip pulse produced by said skip circuit occurs after a clock pulse and before the next successive clock pulse.

4. An improved radio receiver for receiving selected ones of a plurality of radio frequency channels in a sequence, said improved radio receiver comprising:
   a. a source of repetitive clock pulses having a predetermined time period between adjacent clock pulses;
   b. scanning means having a pulse input and a signal output, said scanning means producing a distinct channel signal at said signal output in response to each pulse applied to said pulse input;
   c. oscillator means connected to said scanning means output and to said radio receiver for causing said radio receiver to be receptive to one of said radio frequency channels as determined by said distinct channel signals;
   d. a plurality of memory circuits each having a memory input for scan and skip signals, each having a channel signal input coupled to said scanning means output, and each having an output for producing a scan signal in response to a scan signal applied to said memory input and for producing a skip signal in response to the simultaneous presence of a channel signal applied to said channel signal input and a skip signal applied to said memory input;
   e. and a skip circuit having a plurality of inputs each of which is respectively coupled to one of said memory circuit outputs, having a clock pulse input coupled to said clock pulse source, and having an output coupled to said scanning means pulse input for supplying pulses thereto, said skip circuit supplying a clock pulse to said scanning means in response to all said skip circuit inputs having a scan signal applied thereto and supplying an additional pulse to said scanning means in response to any one of said skip circuit inputs having a skip signal applied thereto.

5. The improved circuit of claim 4 wherein said additional pulse is produced after a clock pulse and before the next subsequent clock pulse.

6. The improved circuit of claim 5 and further comprising means coupled to said scanning means for selectively causing said scanning means to produce a respective channel signal.

7. The improved circuit of claim 5 and further comprising means coupled to said memory circuits for selectively supplying a scan or a skip signal to each of said memory inputs respectively.

8. The improved circuit of claim 5 and further comprising readout means coupled to said skip circuit for indicating a channel when a radio frequency signal is present thereon.

9. An improved circuit for providing selective sequential operation of a plurality of local oscillators for a radio receiver, thereby causing said receiver to be sequentially receptive to a plurality of radio frequencies, said improved circuit comprising:
   a. a search clock for producing repetitive clock pulses at a predetermined rate;
   b. a skip circuit having a pulse input connected to said search clock; a pulse output; a plurality of memory inputs for scan and skip signals; and means connected between said pulse input, said pulse output, and said memory inputs for supplying said clock pulses to said pulse output and for producing a relatively rapid additional pulse at said pulse output in response to a skip signal applied to a memory input;
   c. pulse counter means having an input connected to said skip circuit pulse output and having a pulse count output;
   d. decoder means having a count input connected to said count output of said counter means and having a plurality of outputs each of which produces a respective decoder signal in response to predetermined pulse counts;
   e. a plurality of memory circuits each having a decoder signal input connected to a respective decoder output; each having a memory input; and each having a signal output for producing a steady scan signal in response to a scan signal applied to said memory input, and for producing a skip signal in response to a skip signal applied to said memory input and while a decoder signal is present at said decoder signal input;
   f. means connecting each of said memory circuit signal outputs to a respective skip circuit memory inputs;
   g. and means connected to said decoder means output for causing operation of said local oscillators.

10. The improved circuit of claim 9, and further comprising means connected to said search clock for stopping production of said clock pulses in response to said receiver receiving a radio signal.

11. The improved circuit of claim 10, and further comprising manual means connected to said decoder count inputs for providing selected pulse counts thereto.

12. The improved circuit of claim 10, and further comprising manual means connected to said memory inputs of said memory circuits for selectively applying scan and skip signals thereto.

* * * * *